United States Patent
Shibuya et al.

(10) Patent No.: US 6,445,254 B1
(45) Date of Patent: *Sep. 3, 2002

(54) CRYSTAL OSCILLATOR AND METHOD OF BONDING IC CHIP USEFUL FOR FABRICATING CRYSTAL OSCILLATOR

(75) Inventors: Tatsunobu Shibuya; Susumu Negishi; Hiroshi Uehara; Yasuo Sakaba; Seiji Oda; Xinglong Gong, all of Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 36 days.

This patent is subject to a terminal disclaimer.

(21) Appl. No.: 09/651,023

(22) Filed: Aug. 30, 2000

(30) Foreign Application Priority Data

| Apr. 6, 2000 | (JP) | 2000-105469 |
| May 18, 2000 | (JP) | 2000-146510 |
| Jun. 5, 2000 | (JP) | 2000-167736 |

(51) Int. Cl.$^7$ .................................................. H03B 1/04
(52) U.S. Cl. ............... 331/68; 331/108 D; 331/158; 257/701; 438/112; 310/348; 310/352; 310/353
(58) Field of Search .................. 331/108 D, 68, 331/158; 438/112; 257/701; 310/348, 352, 353

(56) References Cited

U.S. PATENT DOCUMENTS 6,304,151 B1 * 10/2001 Uehara et al. .......... 331/108 D

* cited by examiner

Primary Examiner—Arnold Kinkead
(74) Attorney, Agent, or Firm—Oblon, Spivak, McClelland, Maier & Neustadt, P.C.

(57) ABSTRACT

There is provided a crystal oscillator in which a crystal blank and an integrated circuit (IC) chip are accommodated in a vessel and the IC chip is fixed through a bump to the bottom surface of the vessel by means of ultrasonic thermocompression bonding. The IC chip contains an oscillation circuit utilizing the crystal blank and has a plurality of terminal electrodes on a major surface thereof. A plurality of connection terminal portions are formed on the bottom surface of the concave portion of the vessel so that each of the connection terminal portions corresponds to one of the terminal electrodes. Each of the connection terminal portions is formed into a rectangular shape and the width of each connection terminal portion is identical. The terminal electrodes and the connection terminal portions are bonded to each other through a bump by means of ultrasonic thermocompression bonding. Thus, the IC chip is fixed to the bottom surface of the concave portion of the vessel.

19 Claims, 13 Drawing Sheets

CRYSTAL OSCILLATOR AND METHOD OF BONDING IC CHIP USEFUL FOR FABRICATING CRYSTAL OSCILLATOR

BACKGROUND OF THE INVENTION

1. Field of the Invention

The present invention relates to a crystal oscillator in which a crystal blank and an IC (integrated circuit) chip are accommodated in a vessel and a method of fabricating the same. In more particularly, the present invention relates to a crystal oscillator and a method of fabricating the same in which the IC chip is fixed through a bump to the vessel by means of ultrasonic thermocompression bonding.

2. Description of the Related Art

A crystal oscillator is widely utilized as a device for providing a reference frequency and a reference time in various electronic apparatus including communication equipment. Recently, as is represented by portable equipment such as a portable telephone, the size of the apparatus becomes smaller and smaller. Thus, the crystal oscillator is also requested to be made small. The size requested for the crystal oscillator is, for example, 3 mm×5 mm for the bottom face thereof and 1 mm for the height itself. For this reason, when an IC chip including the crystal oscillator is mounted on a vessel or the like, the manner of mounting is changed from a conventional wire bonding to a face down bonding (FDB) in which one major surface of the IC chip having terminal electrodes formed thereon is brought into the vessel with its face down and bonded to an opposing substrate. As an example of the face down bonding, there has been proposed a bonding method using ultrasonic thermocompression bonding employing a bump.

FIG. 1 is a diagram showing a cross-sectional view of a general arrangement of a crystal oscillator. FIG. 2 is an oblique view showing an outer appearance of the crystal oscillator shown in FIG. 1, and FIG. 3 is a diagram showing a bottom view of the crystal oscillator shown in FIG. 1.

As shown in FIG. 1., the crystal oscillator includes vessel main body 1, IC chip 2 and crystal blank 3 accommodated in vessel main body 1, and cover 4 bonded on vessel main body 1. Vessel main body 1 is formed of bottom wall 5, intermediate frame wall 6 and upper frame wall 7, and thus concave portion 1a and step portion are formed in vessel main body 1. The components constituting vessel main body 1 is made of baked ceramic of a multilayer structure. IC chip 2 has a number of electronic components integrated thereon such as an amplifier and so on constituting an oscillation circuit. On one major surface of IC chip 2, there are provided crystal terminals 8a and 8b utilized when it is connected to crystal blank 3. IC chip 2 is fixed to the bottom surface of concave portion 1a of vessel main body 1 at the one major surface through, for example, bumps 9 by means of ultrasonic thermocompression bonding, in a manner of face down bonding.

As shown in FIG. 4, crystal blank 3 has a substantial rectangular shape and has a pair of excitation electrodes 14a and 14b on both of the major surfaces opposing to each other, respectively. Each of the excitation electrodes 14a and 14b has leading electrode 15a, 15b extended toward the ends opposing to each other in the longitudinal direction of the crystal blank. Crystal blank 3 is fixed to the step portion at both the ends thereof by using conductive adhesive 10. Thus, crystal blank 3 is electrically and mechanically connected to a crystal connection terminal formed at the step portion. Cover 4 is bonded on vessel main body 1 by means of seam welding metal ring 11.

Pair of leading electrodes 15a and 15b of crystal blank 3 extend through a through-hole provided at the step portion of vessel main body 1 and connected to crystal terminals 8a and 8b of IC chip 2. Each of the terminals of power supply, signal output, ground or the like of IC chip 2 is led to the bottom surface or side surface of vessel main body as outer electrode 12. Further, in order to measure electric characteristic of the crystal oscillator and electric characteristic of crystal blank 3 as a unit component, the pair of leading electrodes 15a and 15b of crystal blank 3 are extended to the side surfaces of vessel main body 1 to form measuring terminals 13a and 13b on the side surfaces. In FIG. 1, a portion denoted by a black bold line represents a conductive portion for establishing electric connection such as a through-hole, a conductive path which will be described later on, an electrode, an intetlayer connection or the like.

When the device as a product is shipped, the crystal oscillator contained in the device is subjected to a forcible excitation washing. The forcible excitation washing is carried out as a countermeasure for so-called DLD (Drive Level Dependency) in which crystal oscillator 3 becomes unresponsive in oscillation to a small level of excitation. However, in the arrangement of the above crystal oscillator shown in FIG. 5, measuring terminals 13a and 13b of crystal oscillator 3 are also electrically connected to crystal terminals 8a and 8b of IC chip 2, respectively. For this reason, if a voltage high enough to effect the forcible excitation washing is applied to crystal blank 3 through measuring terminals 13a and 13b, then IC chip 2 can also be applied with the voltage excessively through crystal terminals 8a and 8b, which fact can cause electrical damage on IC chip 2.

General manner of bonding IC chip 2 to a vessel or the like to form a crystal oscillator will hereinafter be described.

As shown in FIG. 6, a plurality of conductive paths 25 as a circuit pattern are formed on a bottom surface, or bottom wall 5 of concave portion 1a of vessel main body 1. A base layer of conductive paths 25 is made of tungsten (W) by printing and burning as a base electrode. Thereafter, a gold (Au) layer is provided on the surface of the base layer by electrolytic plating. In an ordinary manner, conductive path 25 is covered with an insulating material such as alumina or the like (not shown) except for connection terminal portion 26, which serves as an end contact area of conductive path 25, denoted by applying A half-tone notation in FIG. 6. Connection terminal portion 26 is formed into a rectangular shape extending in the longitudinal direction of conductive path 25.

On the other hand, IC chip 2 is supplied as a bare chip or a flip chip. As shown in FIG. 7, IC chip 2 is formed into a rectangular shape having a plurality of terminal electrodes 27 formed along a pair of side edges opposing to each other on one major surface of the chip. Each of terminal electrodes 27 has provided thereon ball-like bump 28 made of a gold grain, for example. When IC chip 2 is mounted in concave portion 1a of vessel main body 1, IC chip 2 is brought into concave portion 1a so that one major surface of the IC chip on which the bumps are provided is opposing relationship with the bottom surface of concave portion 1a and bumps 29 and connection terminal portions 26 are aligned with and bonded to each other. Then, IC chip 2 is pressed and ultrasonic wave is supplied to IC chip 2 by an ultrasonic thermocompression bonding machine so that IC chip 2 is vibrated in the horizontal direction. Thus, bump 28 is crashed and formed into an elliptical shape and electrical connection is established between terminal electrode 27 and connection terminal portion 26 through bump 28. Bonding is achieved by effecting solid phase diffusion in the metal (in this case, gold).

Since crystal blank 3 has a rectangular shape elongated in one direction, the bottom surface of concave portion 1a of vessel main body 1 also becomes elongated rectangular shape. Therefore, if small-sizing of the crystal oscillator is developed, almost no allowance is provided between the side wall of the concave portion and IC chip 2 in the width direction. For this reason, conductive path 5 tends to be provided on both the sides in the longitudinal direction in which certain allowance can be expected. Thus, IC chip 2 is arranged to have terminal electrodes 27 formed on a pair of sides opposing to each other in the longitudinal direction of the chip. Further, the number of terminal electrodes 27 provided along each of the longitudinal sides is arranged to become almost the same (within an extent of 4:6) so that pressing force can be applied uniformly on the IC chip when ultrasonic thermocompression bonding is effected. Further, interval between terminal electrodes 27 is also almost regulated.

Now, IC chip 2 will be further described. As shown in FIG. 8, IC chip 2 is formed of silicon substrate 2a on which amplifiers, resistors, capacitors and so on, which constitute an oscillation circuit, are integrated. On the surface of silicon substrate 2a, there is formed an oxidized film ($SiO_2$) for isolating a P-type region from an N-type region so as to surround the boundary of the frame. Then, an aluminum (Al) film (of which thickness is about 1.2 $\mu$m) is provided over the oxidized film and the frame formed of the oxidized film 2b. Then, terminal electrode 27 is formed so that it is electrically connected to the P-type region or the N-type region. The Al film as terminal electrode 27 is formed by vapor deposition or spattering. In this way, terminal electrode 27 is formed into a recess shape having a step at the periphery thereof. As described above, terminal electrode 27 is formed on a pair of sides opposing to each other of a circuit formation surface of IC chip 2. Bump 28 is formed on the bottom surface of the concave portion of the terminal electrode 27. As shown in FIG. 8, bump 28 may be formed in such a manner that two gold grains are piled on one another in the vertical direction.

FIG. 9 is a diagram showing an IC chip having a bump which is brought into a crashed state owing to face down bonding.

However, in the crystal oscillator of the above arrangement, terminal electrode 27 often suffers from crack and a fragment thereof can be cut away therefrom due to a pressing force with vibration when ultrasonic thermocompression is effected. Further, an internal circuit located beneath terminal electrode 27 or vicinity of the same often suffers from damage, with the result that a connecting portion for connecting terminal electrode 27 to connection terminal portion 26 suffers from connection failure (bonding failure). Thus, the crystal oscillator of the conventional arrangement sometimes consumes an expensive IC chip 2 uselessly, which fact leads to bad yield and low productivity.

Further, vessel main body 1 is made of ceramic. Due to the inherent nature of a mold body made of ceramic, it is difficult to configure the vessel at a high accuracy in shape, dimension, flatness or the like. For this reason, it is also difficult to maintain parallelism between the mounting surface of IC chip 2 and the bottom surface of concave portion 1a of vessel main body 1. If the crystal oscillator for surface mount is made to have a small size such as of 5 mm×3 mm, the vessel main body itself is also small and configured at low accuracy. Further, since IC chip 2 cannot be bent with ease, it is far more difficult to mount IC chip 2 on vessel main body 1 having a small area by means of face down bonding than to mount a part module formed of glass-epoxy resin or the like on a substrate having a large area by means of face down bonding. Thus, it is difficult to establish electrical connection at all of the bonding portions.

SUMMARY OF THE INVENTION

Therefore, an object of the present invention is to provide a crystal oscillator in which it becomes possible to positively avoid bonding failure between a terminal electrode of an IC chip and a connecting terminal portion formed on a bottom surface of a concave portion of a vessel, and hence productivity is improved.

Another object of the present invention is to provide a crystal oscillator in which an internal circuit of the IC chip can be protected from electrical damage, and hence productivity is improved.

Another object of the present invention is to provide a crystal oscillator in which a crystal blank can be subjected to measurement of various characteristics by applying forcible excitation without electrical damage on the IC chip.

Still another object of the present invention is to propose a method of bonding an IC chip as a fabrication processes for producing crystal oscillators at a low rate of defect.

In order to solve the above-identified problems which a conventional crystal oscillator tends to encounter, we carried out investigation to analyze the cause thereof. The following is a knowledge obtained by us.

Each of the conductive path or connection terminal portion on the bottom surface of the concave portion does not always have a regular width, due to a design circumstance such as the difference of the interval of the terminal electrodes on the IC chip. Further, since the base electrode made of tungsten or the like is formed by printing and baking, the height of the conductive path becomes large when the width thereof is narrow while the height of the conductive path becomes small when the width thereof is wide. For this reason, the height of the connection terminal portion is scattered. For example, if a connection terminal portion having a wide width and a small height is provided between connection terminal portions having a narrow width and a large height, pressing force will not be applied to the connection terminal portion having a wide width and a small height satisfactorily, with the result that contact of the connection terminal portion having a wide width and a small height to a bump becomes unsatisfactory. Thus, solid phase diffusion will not be effected between the bump and the connection terminal portion, which fact tends to lead to connection failure between them.

As described above, the terminal electrodes of the IC chip are formed on both the sides opposing to each other, and in correspondence with the terminal electrodes, the connection terminal portions are formed on the bottom surface of the concave portion. Most of the connection terminal portions are formed so as to extend in a direction perpendicular to the pair of sides along which the terminals are arrayed. However, as shown in FIG. 6, some of the connection terminal portions can be formed so as to extend in a direction parallel with the pair of sides along which the terminals are arrayed.

In this case, consideration is given to the relation between the direction of vibration of an ultrasonic wave upon effecting ultrasonic thermocompression bonding and the direction in which the connection terminal portion extends.

As shown in FIG. 10A, if the direction of vibration of the ultrasonic wave applied to the IC chip (indicated by an arrow P) is made in parallel with the longitudinal direction of connection terminal portion 26 of a substantial rectangular shape provided on the end of conductive path 25, bonding will be satisfactorily achieved regardless of the deviation of the bump. Thus, if the direction of vibration of the ultrasonic wave applied to the IC chip is made perpendicular to the pair of sides on which the terminal electrodes of the IC chip are provided, the direction in which most of the conductive paths 25 (connection terminal portions 26) extend becomes coincident with the direction of vibration of bump caused by the ultrasonic wave. Accordingly, satisfactory bonding can be expected at the connection terminal portions.

Conversely, as shown in FIG. 10B, if the direction in which connection terminal portion 26 extends is perpendicular to the direction P of vibration of the ultrasonic wave and the width of connection terminal portion 26 is narrow, then bump 28 will bulge out of the width of connection terminal portion 26 due to the deviation of bump 28 caused by vibration. Thus, connection failure is caused. It is true that to widen the width of connection terminal portion 26 is a possible countermeasure for preventing connection failure. However, the IC chip is requested to be small-sized and have a desired function, and layout of a circuit pattern is determined depending on the request. Thus, the width of connection terminal portion is limited from the design standpoint.

We propose that a plurality of connection terminal portions are arranged to have an identical width for avoiding connection failure. If the plurality of connection terminal portions are arranged to have an identical width, it is expected that all of the connection terminal portions have a substantially identical height. Thus, connection failure caused by unevenness of the height of the connection terminal portions can be avoided.

We also propose that the connection terminal portions are disposed so that the longitudinal directions of the connection terminal portions are parallel with one another, and that the direction of vibration of the ultrasonic wave applied upon effecting ultrasonic thermocompression bonding is made coincident with the longitudinal direction of the connection terminal portions. With this arrangement, the bump can be prevented from bulging out of the contact area upon effecting ultrasonic thermocompression bonding, and connection failure can be prevented.

Further, we found that, in order to avoid crack or the like caused in the terminal electrode upon effecting ultrasonic thermocompression bonding, it is effective to provide a metal layer as a buffer layer on an aluminum layer as the terminal electrode and form a bump on the terminal electrode through the metal layer. It is preferable for the metal layer to be made of gold and formed by plating. Further, it is also preferable for the gold layer to have a thickness larger than that of the aluminum layer constituting the terminal electrode.

Furthermore, we propose an arrangement in which relaying terminals are provided on the external surface of the vessel main body so as to be electrically connected to a pair of excitation terminals of the crystal blank, and another relaying terminals independent of that relaying terminals are provided on the external surface of the vessel main body so as to be electrically connected to the crystal terminal of the IC chip. With this arrangement, the crystal blank can be subjected to measurement of electrical characteristic or forcible excitation washing if necessary by using the relaying terminals electrically connected to the pair of excitation terminals of the crystal blank without damaging the IC chip due to an excessive voltage.

DESCRIPTION OF THE PREFERRED EMBODIMENTS

Figure 1:
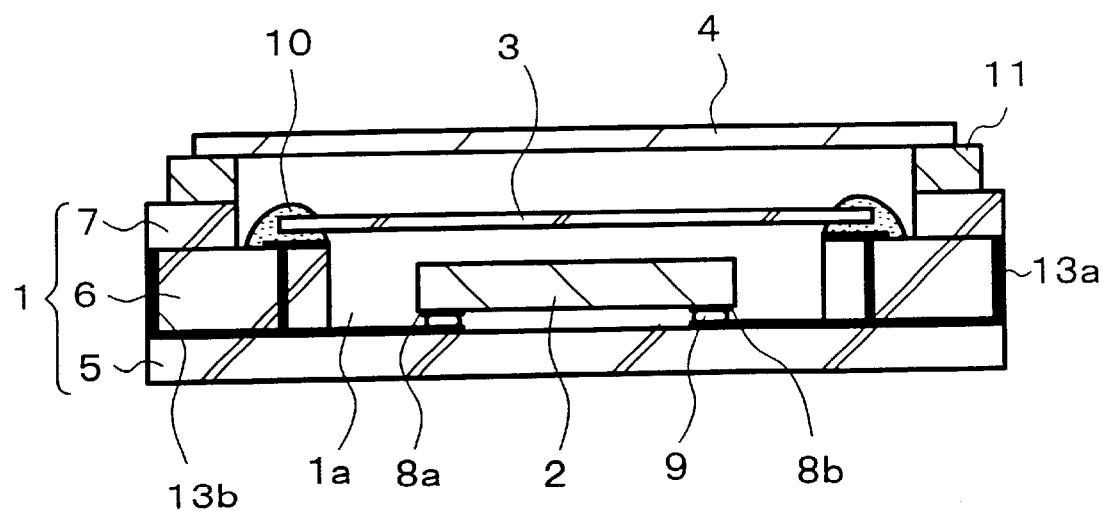
FIG. 1 is a diagram showing a cross-sectional view of a general arrangement of a crystal oscillator.

A crystal oscillator according to a first embodiment of the present invention has substantially the same overall construction as that of a general crystal oscillator illustrated in FIGS. 1 to 7. However, the crystal oscillator according to the first embodiment of the present invention is different from the general crystal oscillator in a circuit pattern formed on a bottom surface of a vessel main body. In the following description, components corresponding to those of FIGS. 1 to 7 are the same components and hence attached with the same reference numerals.

Figure 11:
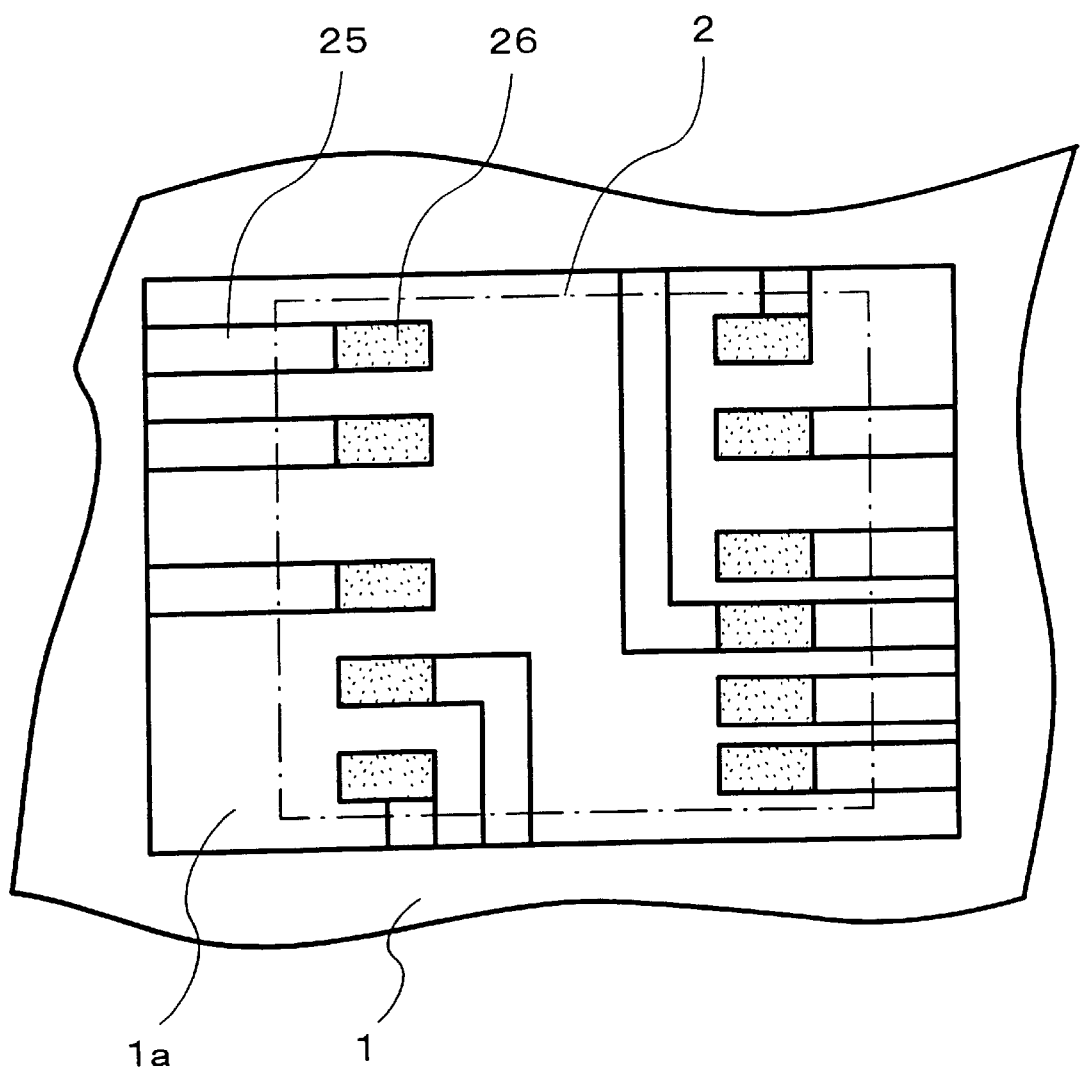
FIG. 11 is a diagram showing one example of a circuit pattern formed on a bottom surface of a concave portion of a vessel main body of the crystal oscillator according to a first embodiment of the present invention.

Similarly to the crystal oscillator shown in FIG. 1, the crystal oscillator of the first embodiment of the present invention has a construction in which IC chip 2 is fixed on a bottom surface of concave portion 1a of vessel main body 1, crystal blank 3 is supported on a step portion in vessel main body 1, and cover 4 is bonded on vessel main body 1 to encapsulate IC chip 2 and crystal blank 3 within concave portion 1a. In the crystal oscillator of the embodiment, as shown in FIG. 11, a plurality of connection terminal portions 26, which serve as end contact areas at the ends of respective conductive paths 25 formed on the bottom surface of concave portion 1a of vessel main body 1, are formed to have an identical width and the same area. Connection terminal portions 26 are disposed so that all of connection terminal portions 26 have the same longitudinal direction, or they are arrayed in parallel with one another. In this example, each of connection terminal portions 26 has the same width as that of conductive path 25.

The crystal oscillator thus arranged is assembled in such a manner that one major surface of IC chip 2 on which terminal electrodes 27 are formed as describe above opposes with the bottom surface of concave portion 1a of vessel main body 1, and each bump 28 provided on each of terminal electrodes 27 arrayed along both the sides of IC chip 2 is brought contact to connection terminal portion 26. Then, IC chip 2 is pressed against vessel main body 1 and ultrasonic wave is applied to IC chip 2 by an ultrasonic thermocompression bonding machine so that bump 26 is vibrated in the longitudinal direction of connection terminal portion 26. Thus, terminal electrode 27 is bonded to connection terminal portion 26 through bump 28.

As described above, since each of connection terminal portions 26 has the same width and area, each of connection terminal portions 26 can be made to have an identical height. Thus, bump 28 on IC chip 2 can be positively bonded to connection terminal portion 26 upon pressing by the ultrasonic thermocompression bonding machine. Accordingly, it becomes possible to avoid connection failure caused by the unevenness of the height of connection terminal portions 26.

Further, connection terminal portions 26 are disposed so that all of connection terminal portions 26 are parallel with one another. Then, the ultrasonic wave is applied so that IC chip 2 (i.e., bump 28) is vibrated in the direction coincident with the longitudinal direction of connection terminal portion 26. According to the manner of ultrasonic wave application, even if bump 28 is deviated in position from the end contact area of connection terminal portion 26, it is expected that the direction of deviation is coincident with the direction in which connection terminal portion 26 extends. Therefore, bump 28 will stay within the area of connection terminal portion 26 and will not bulge out therefrom. It becomes possible to avoid connection failure caused by the layout of connection terminal portions 26 and the vibration direction of IC chip 2, with the result that yield of production of the crystal oscillator can be improved and productivity of the crystal oscillator can also be improved.

While in the above-described embodiment terminal electrodes 27 of IC chip 2 are arrayed along a pair of sides opposing to each other, terminal electrodes 27 may be arrayed along different pair of sides of IC chip 2 perpendicular to that pair of sides. Also in this case, each of connection terminal portions 26 is arranged to have the same width and area, and IC chip 2 is vibrated in a direction coincident with the longitudinal direction of connection terminal portion 26. Thus, advantage similar to that described above will be obtained.

Further, while in the above-described embodiment each of connection terminal portions 26 is arranged to have the same area, the areas may be different from one another so long as the width of connection terminal portion is identical. This is because if the width of connection terminal portions is regulated, all of connection terminal portions can be made to have substantially the same height. However, if the area of connection terminal portions, the height of connection terminal portions will become more uniform.

While in the above-described embodiment both of IC chip 2 and crystal blank 3 are accommodated in concave portion 1a provided in one major surface of vessel main body 1, vessel main body 1 may be formed to have two concave portions in both of the major surfaces, respectively, and IC chip 2 and crystal blank 3 may be accommodated in the two concave portions, respectively. Furthermore, the crystal oscillator may be fabricated in the following manner. That is, IC chip 2 is accommodated in a vessel and encapsulated therein, crystal blank 3 is accommodated in another vessel and encapsulated therein, and thereafter both of the vessels are combined together and necessary electrical connection is established.

A crystal oscillator according to a second embodiment of the present invention will hereinafter be described.

Figure 12:
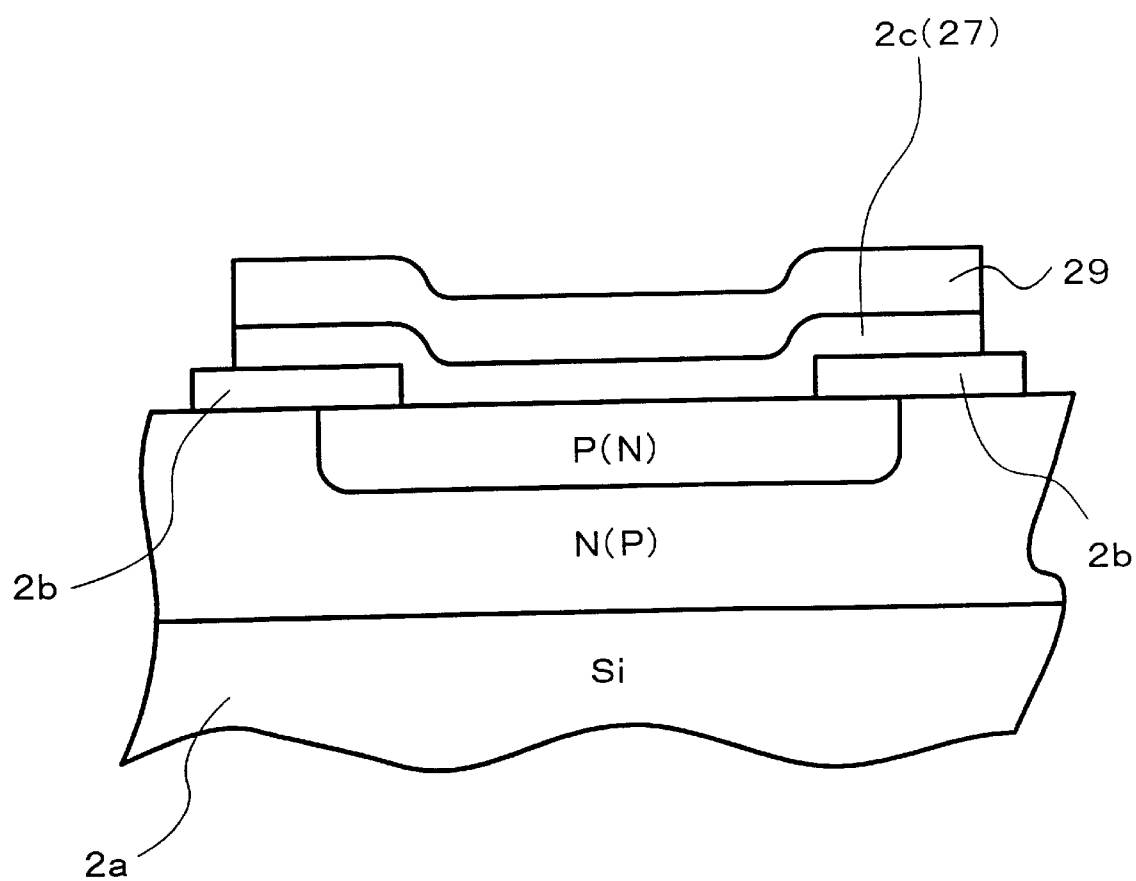
FIG. 12 is a diagram showing a partial cross-sectional view of the IC chip employed in the crystal oscillator according to a second embodiment of the present invention.

In order to efficiently avoid the crack or the like in the terminal electrode in the general crystal oscillator shown in FIGS. 1 to 7 or the above-described crystal oscillator according to the first embodiment upon ultrasonic thermocompression bonding, it is preferable to provide a metal layer as a buffer layer on the aluminum film as the terminal electrode. The metal layer is preferably made of gold. Further, the thickness thereof is preferably larger than that of the aluminum film as the terminal electrode. If such a metal layer is provided on the terminal electrode, shock deriving from the ultrasonic thermocompression bonding can be absorbed. FIG. 12 is a cross-sectional view of an IC chip employed in the crystal oscillator having such a metal layer provided thereon. In the following description, components attached with the same reference numerals as those in FIGS. 1 to 8 designate the same components in FIGS. 1 to 8.

Figure 13:
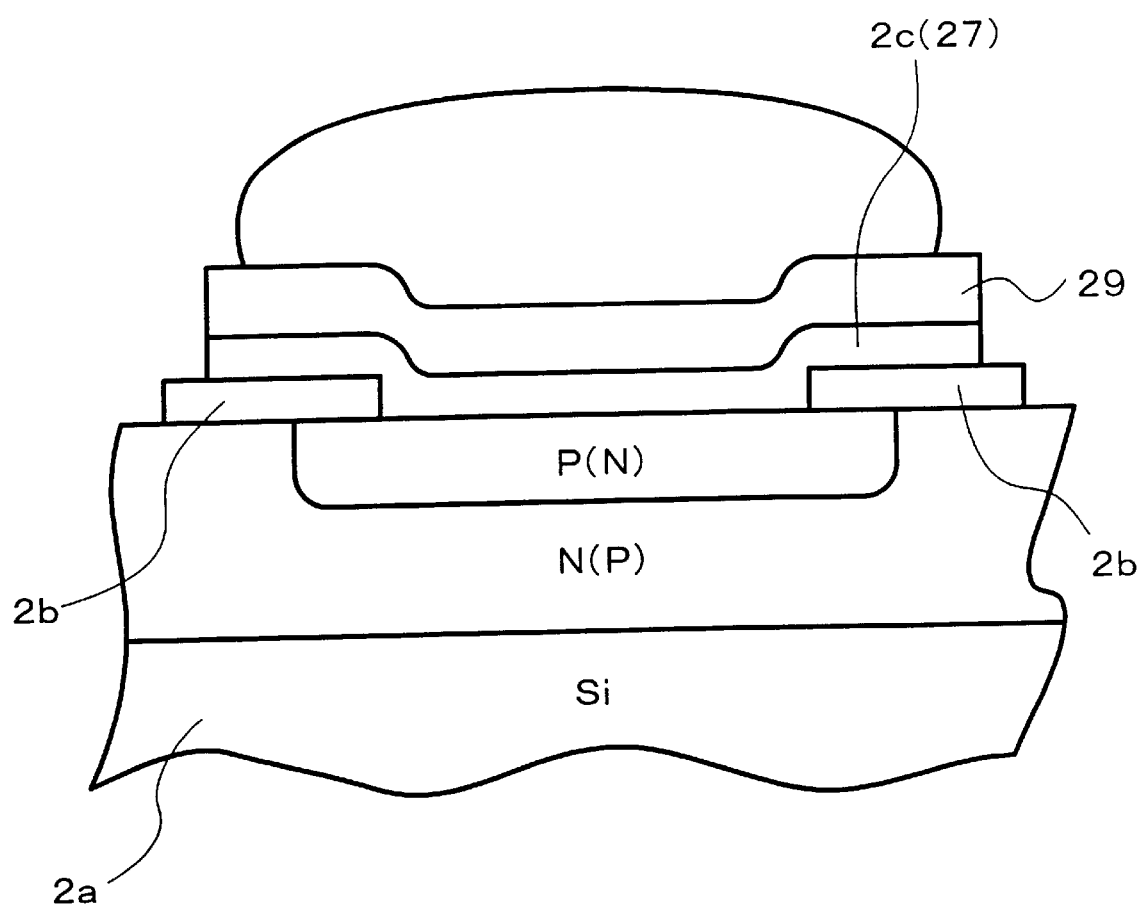
FIG. 13 is a diagram showing a partial cross-sectional view of the IC chip of FIG. 12 when the bump provided thereon is crashed.

Similarly to the construction of the crystal oscillator described above, the crystal oscillator includes vessel main body 1 having concave portion 1a formed in a major surface of the body, IC chip 2 fixed on the bottom surface of concave portion 1a of vessel main body 1, crystal blank 3 supported on a step portion provided in concave portion 1a so as to have a crystal terminal, and cover 4 bonded on vessel main body 1 so as to encapsulate therein IC chip 2 and crystal blank 3. According to the present embodiment, as shown in FIG. 12, gold layer (of which thickness is about 10 $\mu$m) 29 is formed on terminal electrode 27 made of aluminum layer (of which thickness is about 1.2 $\mu$m) of IC chip 2 by electrolytic plating or electroless plating. Then, a bump is provided on the gold layer 29, IC chip 2 is brought into concave portion 1a of vessel main body 1 in a face down fashion, and ultrasonic thermocompression bonding is effected on IC chip 2 so that terminal electrode 27 is bonded to connection terminal portion 26 formed on the bottom surface of concave portion 1a of vessel main body 1 through the bump. FIG. 13 is a diagram illustrative of the state of IC chip 2 when the bump is crashed by the application of ultrasonic thermocompression bonding.

According to the above arrangement, the pressing force or shock upon application of ultrasonic thermocompression bonding can be absorbed by gold layer 29, with the result that the terminal electrode 27 can be prevented from crack or the like and an internal circuit or the like can be protected from damage. Accordingly, yield of the crystal oscillator can be improved and productivity of the same can also be improved. In this case, it is more preferable for gold layer 29 to be formed by plating rather than by vapor deposition, spattering or the like, because sufficient thickness of the layer is ensured.

While in the above-described embodiment metal layer 29 provided on terminal electrode 27 is made of gold, any material can be employed for the metal layer so long as the layer is made to provide sufficient shock absorbing property by enlarging the thickness of the layer. For example, the metal layer may be made of silver (Ag) or aluminum. However, gold is the most preferable material from the practical standpoint because it is full of flexibility and has sufficient shock absorbing property.

Figure 8:
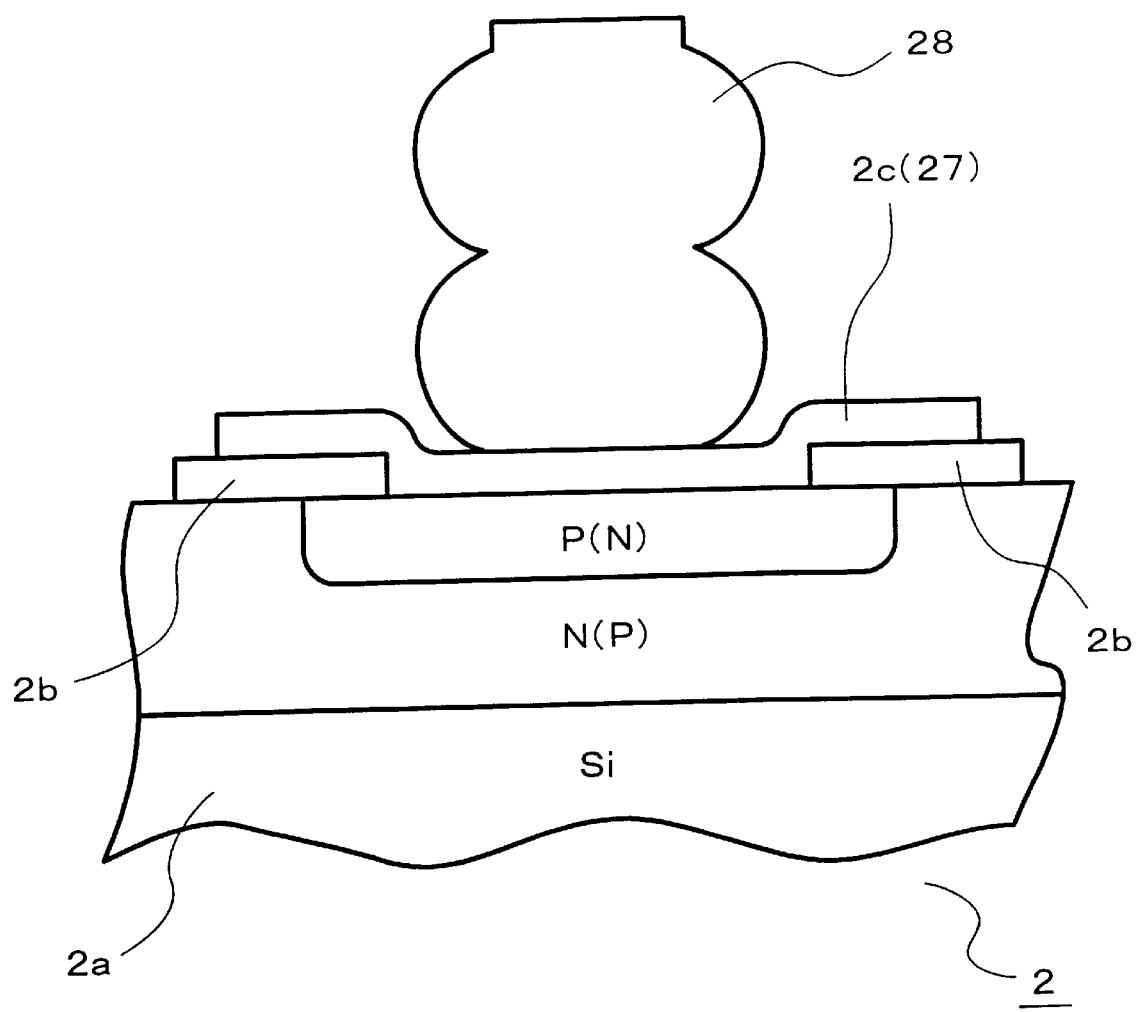
FIG. 8 is a diagram showing a partial cross-sectional view of the IC chip having a bump provided thereon.
Figure 9:
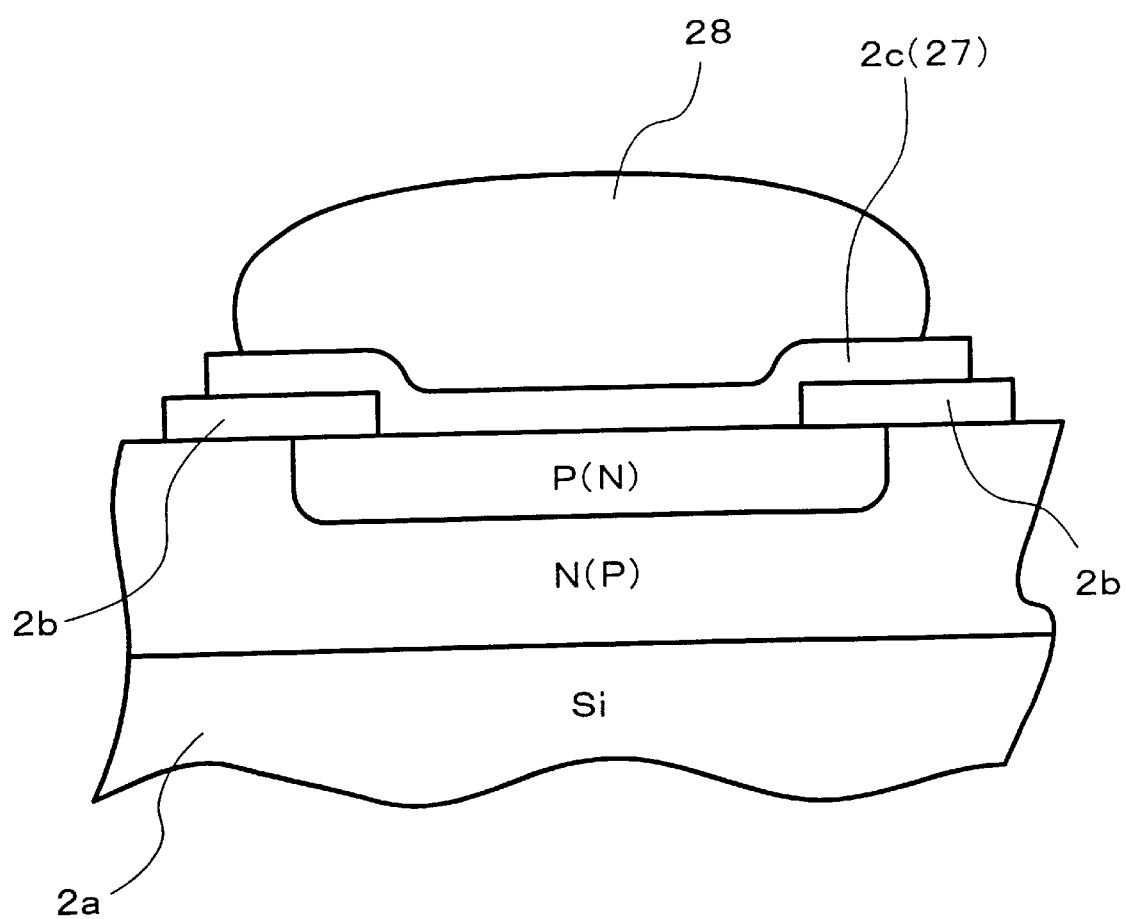
FIG. 9 is a diagram showing a partial cross-sectional view of the IC chip when the bump is crashed.
Figure 10A:
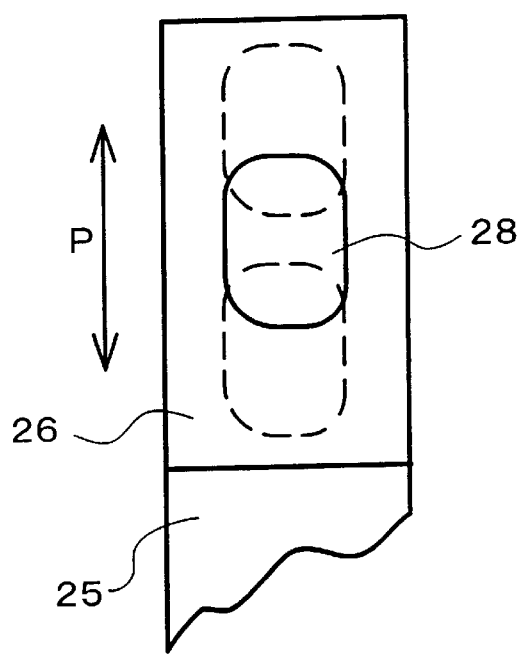
FIGS. 10A and 10B are diagrams of plan view each illustrative of the relation between the shape of a connection terminal portion and the direction of an ultrasonic wave applied to the IC chip.
Figure 10B:
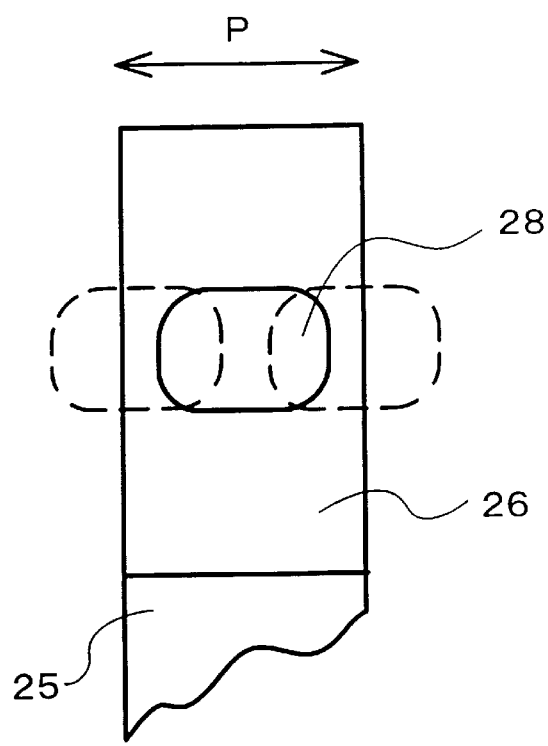

Bump 28 provided on the bottom surface of the recess of the terminal electrode 27 may be formed of two grains piled on one another as shown in FIG. 8. Alternatively, bump 28 may be made of a single grain. As described above, gold layer 29 is directly formed on the aluminum layer. However, there is a fear that aluminum can be diffused into the gold layer and bonding strength between the two layers can be lower. Thus, another metal layer may be interposed between the gold layer and the aluminum layer for preventing the diffusion between the two layers.

A crystal oscillator according to a third embodiment of the present invention will hereinafter be described.

The above-described first and second embodiments are intended to solve problems that connection failure between terminal electrodes 27 of IC chip 2 and connection terminal portions 26 on vessel main body 1 is prevented, terminal electrodes 27 can be protected from crack or the like, and the internal circuit can be prevented from being mechanically destroyed. However, considerable number of failures of fabricated crystal oscillator come from the failure of crystal blank 3 itself. In particular, if the crystal blank is employed in a small-sized crystal oscillator such as that of 5 mm×3 mm, the size of the crystal blank is naturally smaller than 5 mm×3 mm. If the crystal blank is so small-sized, it is difficult to ensure satisfactory oscillating property for all of the crystal blanks in the steps of fabrication.

Figure 5:
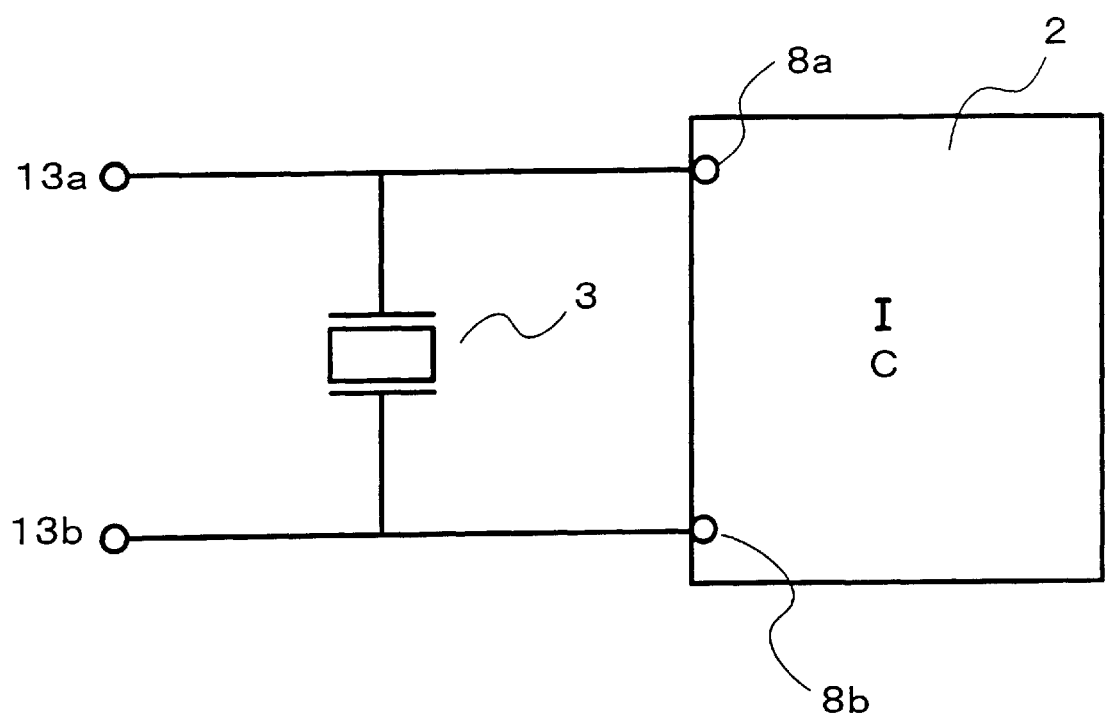
FIG. 5 is a circuit diagram illustrative of how a crystal blank and an IC chip are electrically connected to each other.
Figure 6:
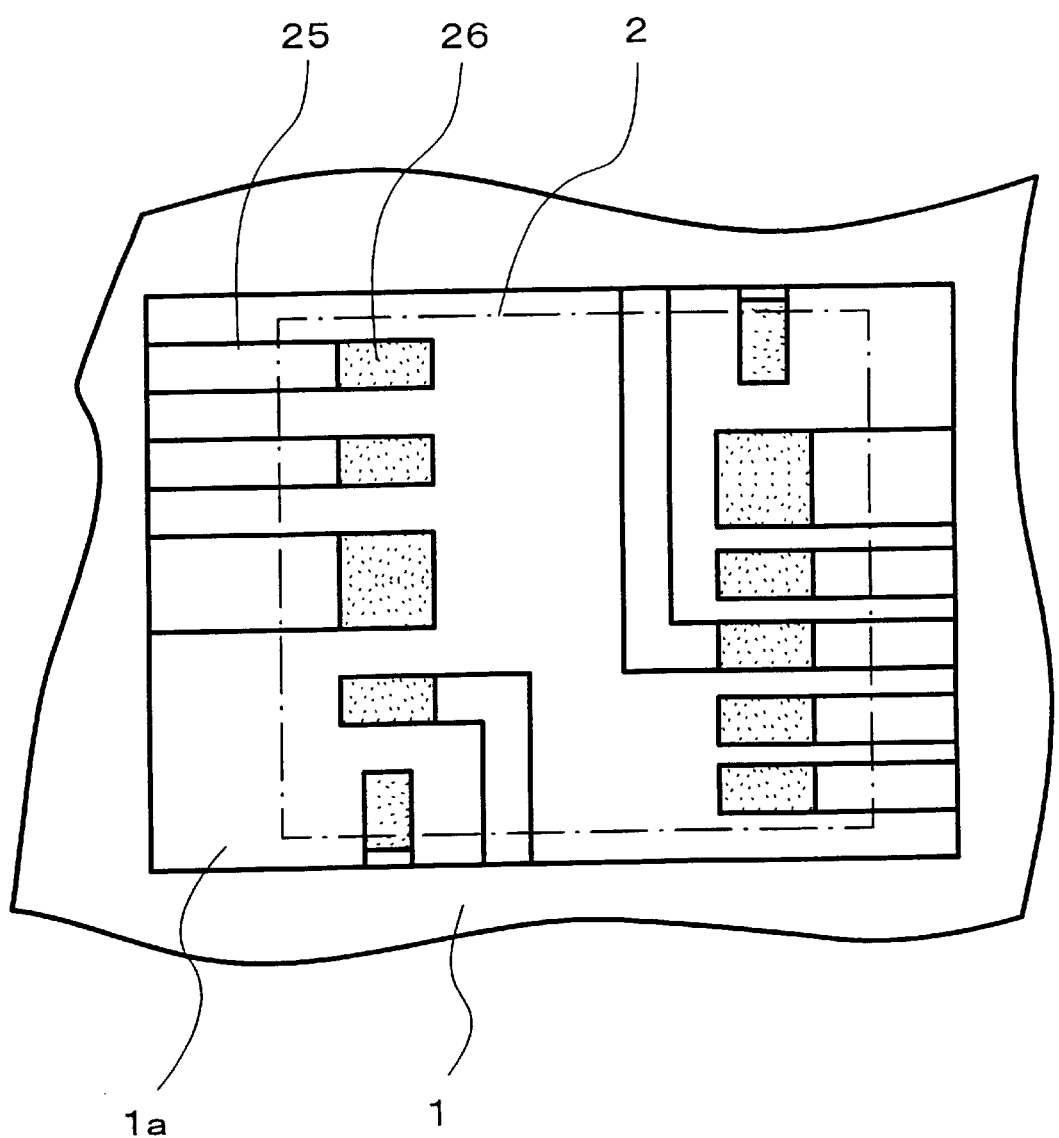
FIG. 6 is a diagram showing one example of a circuit pattern formed on a bottom surface of a concave portion of a vessel main body.
Figure 7:
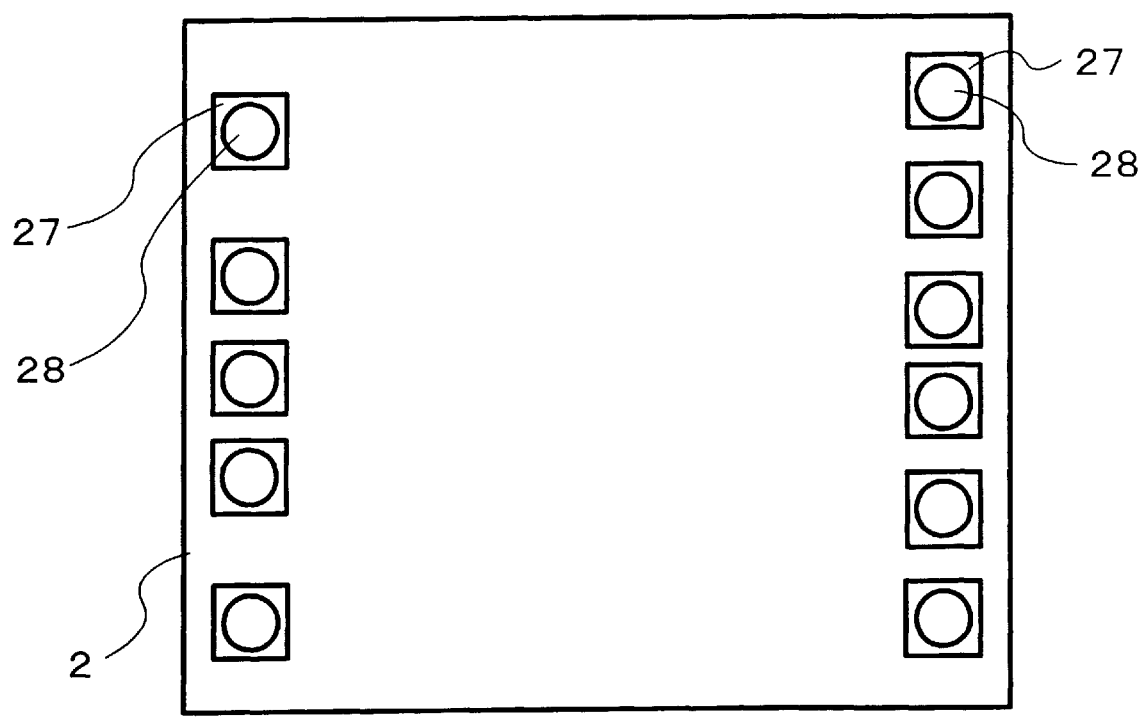
FIG. 7 is a diagram showing a plan view of one major surface of the IC chip.

However, if the crystal oscillator has a construction as described with reference to FIGS. 1 to 7, as will be understood from FIG. 5, crystal blank 3 and IC chip 2 are electrically connected to each other within the crystal oscillator assembly. Therefore, it is difficult to determine which of crystal blank 3 or IC chip 2 the trouble is located in. Further, if crystal blank 3 is subjected to forcible excitation washing, an excessive voltage can be applied to IC chip 2, which can damage IC chip 2. Furthermore, the forcible excitation can be effected to crystal blank 3 from the outside as a method of restoring the characteristic of crystal blank 3. Also in this case, IC chip 2 can be damaged. In general, a voltage of forcible excitation for restoring the characteristic of crystal blank 3 is higher than that of forcible excitation for washing.

According to the third embodiment of the present invention, there is provided an arrangement in which a first pair of relaying terminals are provided on the external surface of the vessel main body so as to be electrically connected to a pair of excitation terminals of the crystal blank, and second pair of relaying terminals independent of the first relaying terminals are provided on the external surface of the vessel main body so as to be electrically connected to the crystal terminals of the IC chip. With this arrangement, the crystal blank can be subjected to measurement of electrical characteristic or forcible excitation washing if necessary by using the first pair of relaying terminals electrically connected to the pair of excitation terminals of the crystal blank without damaging the IC chip due to an excessive voltage. After measurement of the electrical characteristic of the crystal blank, the first pair of relaying terminals may be electrically connected to the second pair of relaying terminals. Thus, the crystal oscillator is accomplished.

Figure 14:
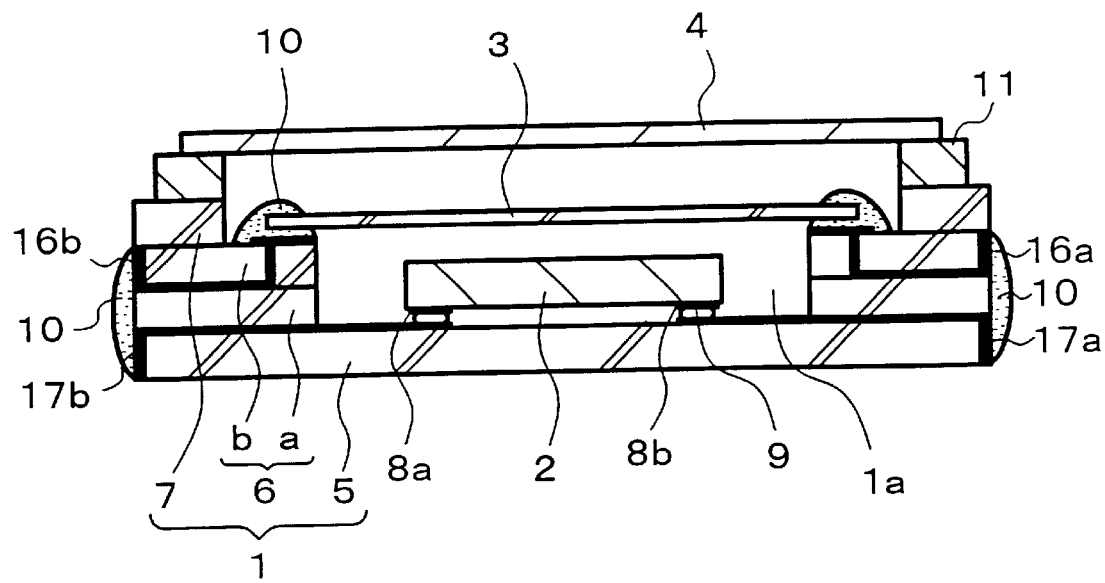
FIG. 14 is a diagram showing a cross-sectional view of a crystal oscillator according to a third embodiment of the present invention.
Figure 15:
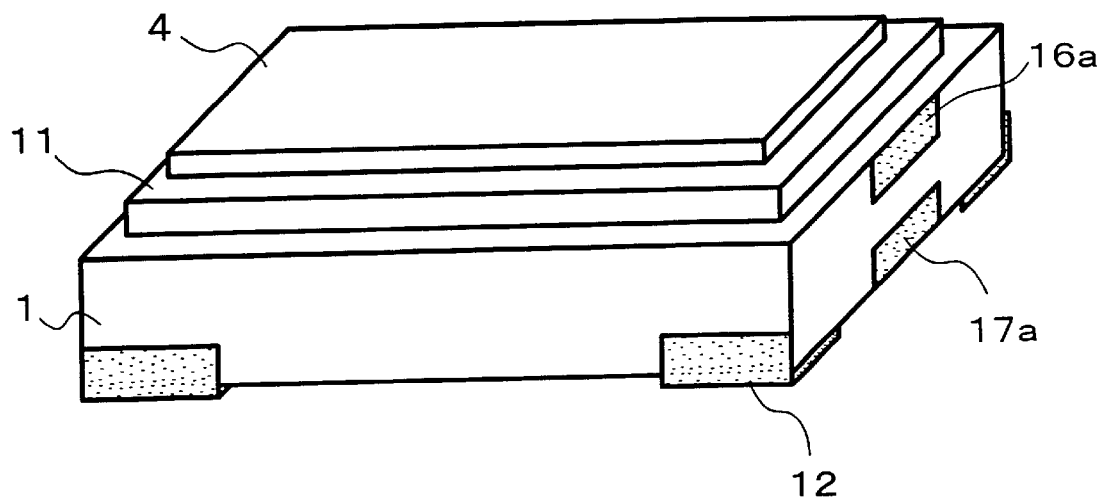
FIG. 15 is a diagram showing an oblique view of an external appearance of the crystal oscillator shown in FIG. 14.

FIG. 14 is a diagram showing a cross-sectional view of one example of a crystal oscillator according to the third embodiment of the present invention. FIG. 15 is an outward appearance of the crystal oscillator shown in FIG. 14. In the following description, components attached with the same reference numerals as those of FIGS. 1 to 7 are the same components. Further, in FIG. 14, portions indicated by a black bold line is a portion for establishing electrical connection such as a conductive path, connection terminal portion, an electrode, an interlayer connection or the like.

Figure 2:
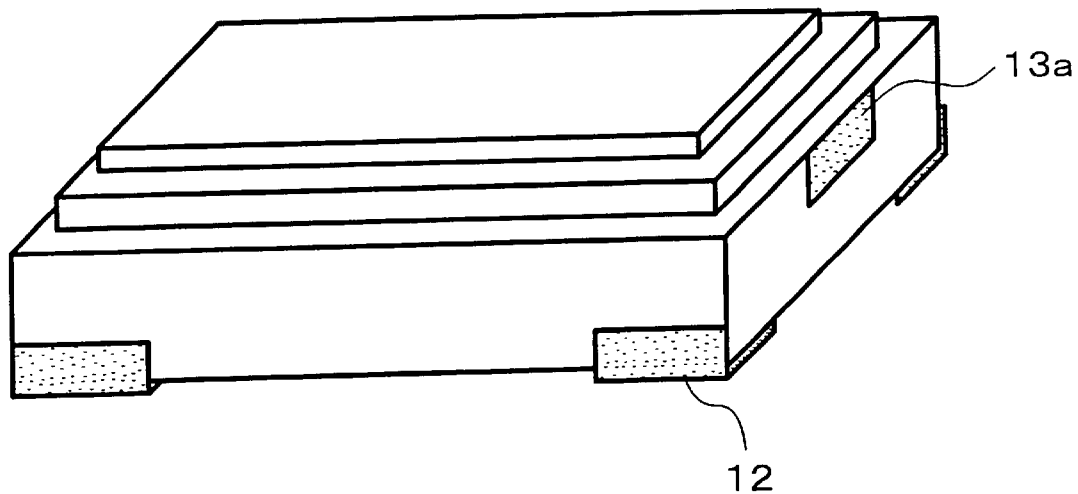
FIG. 2 is a diagram showing an oblique view of an external appearance of the crystal oscillator shown in FIG. 1.
Figure 3:
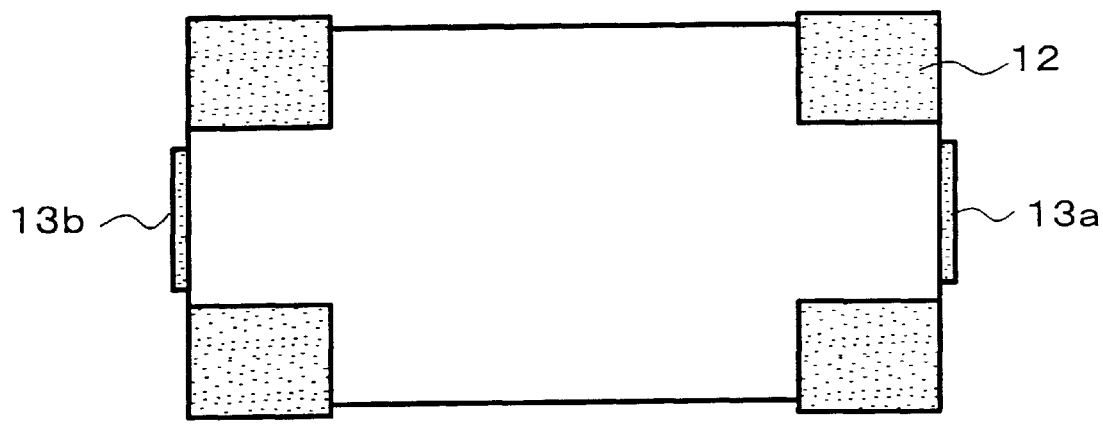
FIG. 3 is a diagram showing a bottom view of the crystal oscillator shown in FIG. 1.
Figure 4:
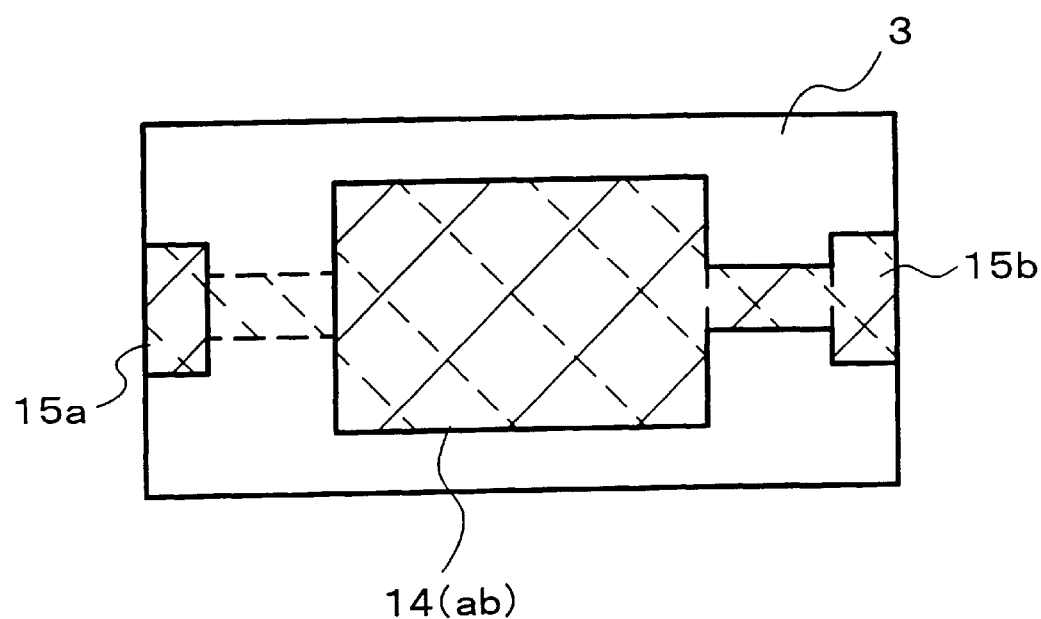
FIG. 4 is a diagram showing a plan view of a crystal blank.

Similarly to the arrangement shown in FIGS. 1 and 2, the crystal oscillator of the third embodiment includes vessel main body 1 having concave portion 1a formed in one major surface of the vessel main body 1, IC chip 2 fixed on the bottom surface of concave portion 1a, and crystal blank Ti* 3 fixed to the step portion of vessel main body 1 through a pair of leading electrodes 15a and 15b (see FIG. 4) which are provided on both the side edges of crystal blank 3. In this case, intermediate frame wall 6 of vessel main body 1 is formed as a lamination structure composed of layers 6a and 6b. Leading electrodes 15a and 15b of crystal blank 3 electrically extend through a through-hole of the step portion and an interface between first layer 6a and second layer 6b of intermediate frame wall 6, and then constitute first pair of relaying electrodes 16a and 16b. Crystal terminals 8a and 8b of IC chip 2 electrically extend from the interface between bottom wall 5 and intermediate frame wall 6 and constitute second pair of relaying terminals 17a and 17b as IC relaying terminals on the side surface of bottom wall 5. Thus, first pair of relaying electrodes 16a and 16b and second pair of relaying terminals 17a and 17b are formed on a pair of side surfaces of vessel main body 1 opposing to each other. According to the arrangement of the crystal oscillator, crystal blank 3 can be exclusively subjected to measurement for various characteristics thereof or forcible excitation washing due to DLD by using first relaying terminals 16a and 16b. After the measurement of characteristics or the forcible excitation washing is completed, one of first pair of relaying electrodes 16a and 16b and corresponding one of second pair of relaying terminals 17a and 17b are electrically connected on respective side walls of vessel main body 1 by using conductive adhesive 10, for example.

According to the above arrangement, the crystal blank as a crystal oscillation element can be subjected to the measurement of characteristics and/or the forcible excitation washing under condition that crystal blank 3 and IC chip 2 are electrically insulated from each other. Therefore, IC chip 2 can be protected from electrical destruction even if an excessive voltage is applied to crystal blank 3 for effecting forcible excitation. Thus, crystal blank 3 can be applied with a sufficient level of voltage for effecting forcible excitation and satisfactory DLD characteristic can be obtained in crystal blank 3.

Figure 16:
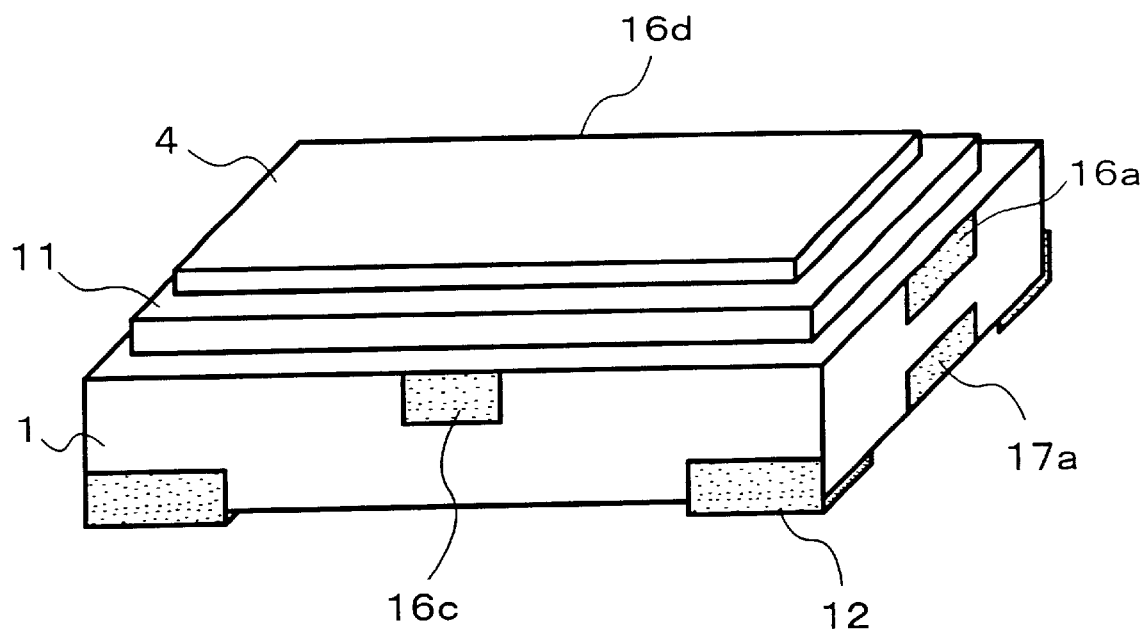
FIG. 16 is a diagram showing an oblique view of another example of the crystal oscillator according to the third embodiment of the present invention.

FIG. 16 is a diagram showing one modification of the third embodiment of the present invention. A crystal oscillator shown in FIG. 16 has a third pair of relaying terminals 16c and 16d provided on another side surfaces opposing to each other, in addition to the first pair of relaying terminals 16a and 16b and the second pair of relaying terminals 17a and 17b, which are similar to those of the crystal oscillator shown in FIGS. 14 and 15. When the crystal oscillator of this modification of the third embodiment constructed as described above is subjected to the measurement of various characteristics and the forcible excitation washing, third pair of relaying terminals 16c and 16d formed on the other pair of side surfaces are utilized. After the measurement of characteristics and the forcible excitation washing are completed, first pair of relaying terminals 16a and 16b and second pair of relaying terminals 17a and 17b are electrically connected in the manner described above.

According to this modification of the third embodiment of the crystal oscillator, similarly to the arrangement shown in FIGS. 14 and 15, crystal blank 3 and IC chip 2 are electrically insulated from each other. Therefore, crystal blank 3 can be subjected to the measurement of characteristics and the forcible excitation washing without damaging IC chip 2. Moreover, since the crystal oscillator as this modification has third pair of relaying terminals 16c and 16d independently provided on the other side surfaces of vessel main body 1 opposing to each other, it is easy to contact a probe to the relaying terminals. Therefore, measuring work can be carried out with ease. If the arrangement of the crystal oscillator does not have such pair of relaying terminals like the arrangement shown in FIGS. 14 and 15, it is requested for the probe not to contact to second relaying terminal 17a and 17b upon measuring the characteristics or the like. Therefore, if the arrangement of the crystal oscillator having no such pair of relaying terminals is made to have a small height, and hence there is small allowance between one of first relaying terminals 16a and 16b and corresponding one of second relaying terminals 17a and 17b, it will become more likely to bring about an erroneous contact of the probe to the one of second relaying terminals 17a and 17b, which fact makes it more difficult to carry out measuring work.

While in the above-described embodiments crystal blank 3 is fixed at both the ends thereof through extended leading electrodes 15a and 15b, both of leading electrodes 15a and 15b may be led to one side surface and electrical contact may be achieved at this side. In this case, crystal blank 3 will have different circuit pattern from the above-introduced one. First relaying electrodes 16a and 16b can be arbitrarily extended so as to electrically connected to leading electrodes 15a and 15b and excitation electrodes 14a and 14b.

Figure 17:
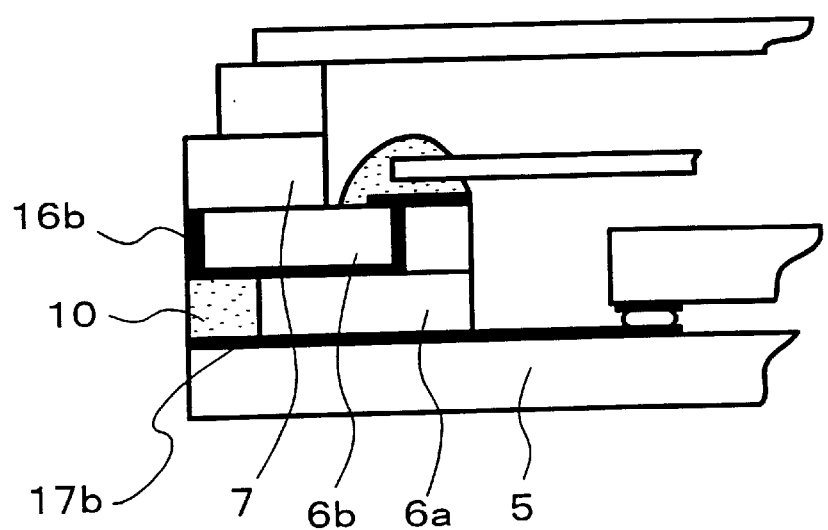
FIG. 17 is a diagram showing a cross-sectional view of still another example of the crystal oscillator according to the third embodiment of the present invention.

Further, according to the above-described embodiments, second relaying terminals 17a and 17b are extended to the side surface of the bottom wall and bonded to first relaying terminals 16a and 16b with conductive adhesive 10. In this case, conductive adhesive 10 can protrude from a level flush with the side wall of the vessel main body, with the result that the crystal oscillator can be deformed in terms of the outer dimension thereof, or alternatively, undesirable contact can be brought about between the crystal oscillator and a circuit pattern of a circuit board on which the crystal oscillator is to be mounted. Thus, as shown in FIG. 17, second relaying terminals 17a and 17b are formed so as to extend only on the upper surface of bottom wall 5, first layer 6a of intermediate frame wall 6 is made short so as to form a recess at the side surface of vessel main body 1, and the recess is filled with conductive adhesive 10 so as to establish electrical contact between one of first relaying terminals 16a and 16b and corresponding one of second relaying terminals 17a and 17b.

While several preferable embodiments of the present invention have been described, it should be noted that the method of mounting the IC chip introduced in the description of the first and second embodiments of the present invention is not restrictively applied to a case where a crystal oscillator is fabricated, but the method can be effectively applied to any case where an IC chip of various field undergoes a step of mounting.

What is claimed is:

1. A crystal oscillator comprising:
a vessel main body having a concave portion;
a cover bonded to the vessel main body to form an encapsulated vessel;
a crystal blank held within the vessel;
an IC (integrated circuit) chip containing an oscillation circuit utilizing the crystal blank and having a plurality of terminal electrodes on one major surface thereof; and
a plurality of connection terminal portions formed on a bottom surface of the concave portion so that each of the connection terminal portions corresponds to one of the terminal electrodes, wherein
the terminal electrodes and the connection terminal portions are bonded to each other through a bump so that the integrated circuit chip is fixed to the bottom surface, and
each of the connection terminal portions is formed into a rectangular shape having an identical width.

2. A crystal oscillator according to claim 1, wherein the terminal electrodes and the connection terminal portions are bonded to each other through the bump by means of ultrasonic thermocompression bonding which is effected so that vibration direction of ultrasonic wave is coincident with longitudinal direction of the connection terminal portions.

3. A crystal oscillator according to claim 1, wherein the crystal blank is substantial rectangular shape and the terminal electrodes are formed along each of shorter sides of the crystal blank.

4. A crystal oscillator according to claim 1, wherein the IC chip is a bare chip.

5. A crystal oscillator comprising:
a vessel main body having a concave portion;
a cover bonded to the vessel main body to form an encapsulated vessel;
a crystal blank held within the vessel;
an IC (integrated circuit) chip containing an oscillation circuit utilizing the crystal blank and having a plurality of terminal electrodes on one major surface thereof; and
a plurality of connection terminal portions formed on a bottom surface of the concave portion so that each of the connection terminal portions corresponds to one of the terminal electrodes, wherein
the terminal electrodes and the connection terminal portions are bonded to each other through a bump by means of ultrasonic thermocompression bonding so that the IC chip is fixed to the bottom surface, and
each of the connection terminal portions is formed into a rectangular shape and longitudinal direction of the connection terminal portions are in parallel with one another.

6. A crystal oscillator according to claim 5, wherein vibration direction of the ultrasonic wave upon ultrasonic thermocompression is coincident with the longitudinal direction of the connection terminal portions.

7. A crystal oscillator according to claim 5, wherein the crystal blank is substantial rectangular shape and the terminal electrodes are formed along each of shorter sides of the crystal blank.

8. A crystal oscillator according to claim 5, wherein the IC chip is a bare chip.

9. A crystal oscillator comprising:
a vessel main body having a concave portion;
a cover bonded to the vessel main body to form an encapsulated vessel;

a crystal blank held within the vessel;

an IC (integrated circuit) chip containing a silicon substrate and a circuit provided on the silicon substrate, and having a plurality of terminal electrodes on one major surface thereof; and a plurality of connection terminal portions formed on a bottom surface of the concave portion so that each of the connection terminal portions corresponds to one of the terminal electrodes, wherein the terminal electrodes and the connection terminal portions are bonded to each other through a bump so that the IC chip is fixed to the bottom surface, and the terminal electrodes are made of an aluminum layer, a metal layer having a thickness larger than that of the aluminum layer is formed on the terminal electrodes, and the terminal electrodes are bonded to the bump through the metal layer.

10. A crystal oscillator according to claim 9, wherein the metal layer is a gold layer.

11. A crystal oscillator according to claim 9, wherein the IC chip is a bare chip.

12. A crystal oscillator according to claim 9, wherein the terminal electrodes and the connection terminal portions are bonded to each other through the bump by means of ultrasonic thermocompression bonding.

13. A crystal oscillator comprising:

a vessel;

a outer electrode for surface mount provided on an external bottom surface and an external side surface of the vessel;

a crystal blank held within the vessel and having a pair of excitation electrodes;

an IC (integrated circuit) chip having a pair of crystal electrodes to be electrically connected to the pair of excitation electrodes, containing an oscillation circuit utilizing the crystal blank, and fixed within the vessel;

a first pair of relaying electrodes electrically connected to the pair of excitation electrodes and led to the external side surface of the vessel; and a second pair of relaying electrodes provided to be independent of the first pair of relaying electrodes, electrically connected to the pair of crystal electrodes, and led to the external side surface of the vessel.

14. A crystal oscillator according to claim 13, wherein the first pair of relaying electrodes and the second pair of relaying electrodes are electrically connected to each other on the external side surface of the vessel.

15. A crystal oscillator according to claim 13, wherein the electric characteristic of the crystal blank is tested by using the first pair of relaying electrodes, and thereafter the first pair of relaying electrodes and the second pair of relaying electrodes are electrically connected to each other on the external side surface of the vessel.

16. A method of bonding an IC (integrated circuit) chip useful for fabricating a crystal oscillator, the crystal oscillator including a vessel main body having a concave portion, a cover bonded to the vessel main body to form an encapsulated vessel, a crystal blank held within the vessel, the IC chip containing an oscillation circuit utilizing the crystal blank and having a plurality of terminal electrodes on one major surface thereof, and a plurality of connection terminal portions formed on a bottom surface of the concave portion so that each of the connection terminal portions corresponds to one of the terminal electrodes, wherein each of the connection terminal portions is formed into a rectangular shape having an identical width, the method comprising the steps of:

forming a bump on the terminal electrodes aligning each of the terminal electrodes with a corresponding one of the connection terminal portions; and thereafter bonding the terminal electrodes to the connection terminal portions through the bump by means of ultrasonic thermocompression using a ultrasonic wave of which vibration direction is coincident with longitudinal direction of the connection terminal portions.

17. A method of bonding an IC (integrated circuit) chip useful for fabricating a crystal oscillator, the crystal oscillator including a vessel main body having a concave portion, a cover bonded to the vessel main body to form an encapsulated vessel, a crystal blank held within the vessel, the IC chip containing an oscillation circuit utilizing the crystal blank and having a plurality of terminal electrodes on one major surface thereof, and a plurality of connection terminal portions formed on the bottom surface of the concave portion so that each of the connection terminal portions corresponds to one of the terminal electrodes, wherein each of the connection terminal portions is formed into a rectangular shape and longitudinal direction of the connection terminal portions are in parallel with one another, the method comprising the steps of:

forming a bump on the terminal electrodes;

aligning each of the terminal electrodes with a corresponding one of the connection terminal portions; and thereafter bonding the terminal electrodes to the connection terminal portions through the bump by means of ultrasonic thermocompression bonding using a ultrasonic wave of which vibration direction is coincident with the longitudinal direction of the connection terminal portions.

18. A method of bonding an IC (integrated circuit) chip useful for fabricating a crystal oscillator, the crystal oscillator including a vessel main body having a concave portion, a cover bonded to the vessel main body to form an encapsulated vessel, a crystal blank held within the vessel, the IC chip containing a silicon substrate and a circuit provided on the silicon substrate and having a plurality of terminal electrodes made of aluminum layer on one major surface thereof, and a plurality of connection terminal portions formed on the bottom surface of the concave portion so that each of the connection terminal portions corresponds to one of the terminal electrodes, the method comprising the steps of:

forming a metal layer on the terminal electrodes so that the metal layer has a thickness larger than that of the aluminum layer constituting the terminal electrodes;

forming a bump on the metal layer;

aligning each of the terminal electrodes with a corresponding one of the connection terminal portions; and thereafter bonding the terminal electrodes to the connection terminal portions through the bump by means of ultrasonic thermocompression bonding.

19. A method of bonding an IC chip according to claim 18, wherein the metal layer is formed in such a manner that a gold layer is formed by plating.

* * * * *